United States Patent
Blaschke et al.

(10) Patent No.: US 7,154,161 B1
(45) Date of Patent: Dec. 26, 2006

(54) COMPOSITE GROUND SHIELD FOR PASSIVE COMPONENTS IN A SEMICONDUCTOR DIE

(75) Inventors: Volker A. Blaschke, Irvine, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 40 days.

(21) Appl. No.: 10/826,507

(22) Filed: Apr. 16, 2004

(51) Int. Cl.
*H01L 29/00* (2006.01)
(52) U.S. Cl. .................. 257/531; 257/659; 257/904; 257/347; 438/381
(58) Field of Classification Search .............. 361/328; 336/200, 328; 438/381; 257/904, 531, 347
See application file for complete search history.

(56) References Cited

U.S. PATENT DOCUMENTS

| | | | |
|---|---|---|---|
| 5,760,456 A * | 6/1998 | Grzegorek et al. | 257/531 |
| 6,030,887 A * | 2/2000 | Desai et al. | 438/507 |
| 6,452,249 B1 * | 9/2002 | Maeda et al. | 257/531 |
| 6,831,332 B1 * | 12/2004 | D'Anna et al. | 257/343 |

OTHER PUBLICATIONS

C. Patrick Yue and S. Simon Wong, "On-Chip Spiral Inductors with Patterned Ground Shields for Si-Based RF-IC's" IEEE Journal of Solid-State Circuits, vol. 33, No. 5, May 1998, pp. 743-751.
Kihong Kim and Kenneth O., "Characteristics of an Integrated Spiral Inductor with an Underlying n-Well" IEEE Transactions on Electron Devices, vol. 44, No. 9, Sep. 1997, pp. 1565-1567.

* cited by examiner

*Primary Examiner*—Zandra V. Smith
*Assistant Examiner*—Tsz Chiu
(74) *Attorney, Agent, or Firm*—Farjami & Farjami LLP

(57) ABSTRACT

According to one exemplary embodiment, a structure situated in a semiconductor die comprises an active shield situated in a substrate, where the active shield comprises a salicide layer situated on an active region, and where the active shield has a first conductivity type. The active shield can be situated in a well in the substrate, where the well is connected to a voltage source greater than or equal to a ground voltage, and where the well has a second conductivity type. According to this exemplary embodiment, the structure further comprises a passive component situated in an interconnect metal layer in the semiconductor die, where the passive component is situated above the active shield, and where the active shield defines an AC ground for the passive component. The structure further comprises at least one contact, where the at least one contact connects the active shield to a semiconductor die AC ground.

19 Claims, 3 Drawing Sheets

US 7,154,161 B1

COMPOSITE GROUND SHIELD FOR PASSIVE COMPONENTS IN A SEMICONDUCTOR DIE

BACKGROUND OF THE INVENTION

1. Field of the Invention

The present invention is generally in the field of semiconductors. More specifically, the invention is in the field of ground shields in semiconductor dies.

2. Related Art

Accurate modeling of passive components, such as inductors, in a circuit design requires a clearly defined AC ground. This AC ground can be defined by using substrate contacts, which can be formed close to the passive component, or a metal or polysilicon ground shield situated below the passive component. The substrate contacts and ground shield can be electrically connected to a ground in an interconnect metal layer, such as interconnect metal layer one, i.e. "M1," in a semiconductor die. For an inductor, a ground shield can cause a desirable increase in the inductor's quality factor ("Q") while causing an undesirable increase in the inductor's capacitance, which can decrease the usable range of the inductor. By way of background, a ground shield causes a capacitance effect on an inductor that is inversely proportional to the distance between the interconnect metal layer that the inductor is fabricated in and the ground shield. In contrast to a ground shield, substrate contacts situated close to the inductor yield a lower increase in the inductor's Q while causing a less severe capacitance effect.

The use of a metal shield, which can be patterned in M1, or a polysilicon shield have been suggested to obtain an inductor having an higher quality factor ("Q"). However, a metal shield formed in M1 can severely degrade the usable frequency range or self resonance frequency ("SRF") of an inductor by as much as 30%. Although a polysilicon shield causes only approximately one half of the SRF degradation caused by the metal shield, the Q of the inductor that is obtainable with the polysilicon shield is lower than the Q that can be realized with the metal shield.

Thus, there is a need in the art for a more effective ground shield for a passive component, such as an inductor, fabricated in a semiconductor die.

SUMMARY OF THE INVENTION

The present invention is directed to composite ground shield for passive components in a semiconductor die. The present invention addresses and resolves the need in the art for a more effective ground shield for a passive component, such as an inductor, fabricated in a semiconductor die.

According to one exemplary embodiment, a structure situated in a semiconductor die comprises an active shield situated in a substrate, where the active shield comprises a salicide layer situated on an active region, and where the active shield has a first conductivity type. The salicide layer may comprise titanium silicide, cobalt silicide, and nickel mono-silicide, for example. The active shield can further comprise a plurality of fingers, where each of the plurality of fingers comprises a salicide segment situated on an active segment. The active shield can be situated in a well in the substrate, where the well is connected to a voltage source greater than or equal to a ground voltage and having no AC component, and where the well has a second conductivity type.

According to this exemplary embodiment, the structure further comprises a passive component situated in an interconnect metal layer in the semiconductor die, where the passive component is situated above the active shield, and where the active shield defines an AC ground for the passive component. The passive component can be an inductor, for example. The structure further comprises at least one contact, where the at least one contact connects the active shield to a semiconductor die AC ground. The structure can further comprise a salicided active region situated adjacent to at least one side of the active shield, where the salicided active region has the second conductivity type. Other features and advantages of the present invention will become more readily apparent to those of ordinary skill in the art after reviewing the following detailed description and accompanying drawings.

DETAILED DESCRIPTION OF THE INVENTION

The present invention is directed to composite ground shield for passive components in a semiconductor die. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the invention are not specifically described in the present application and are not specifically illustrated by the present drawings.

Figure 1A:
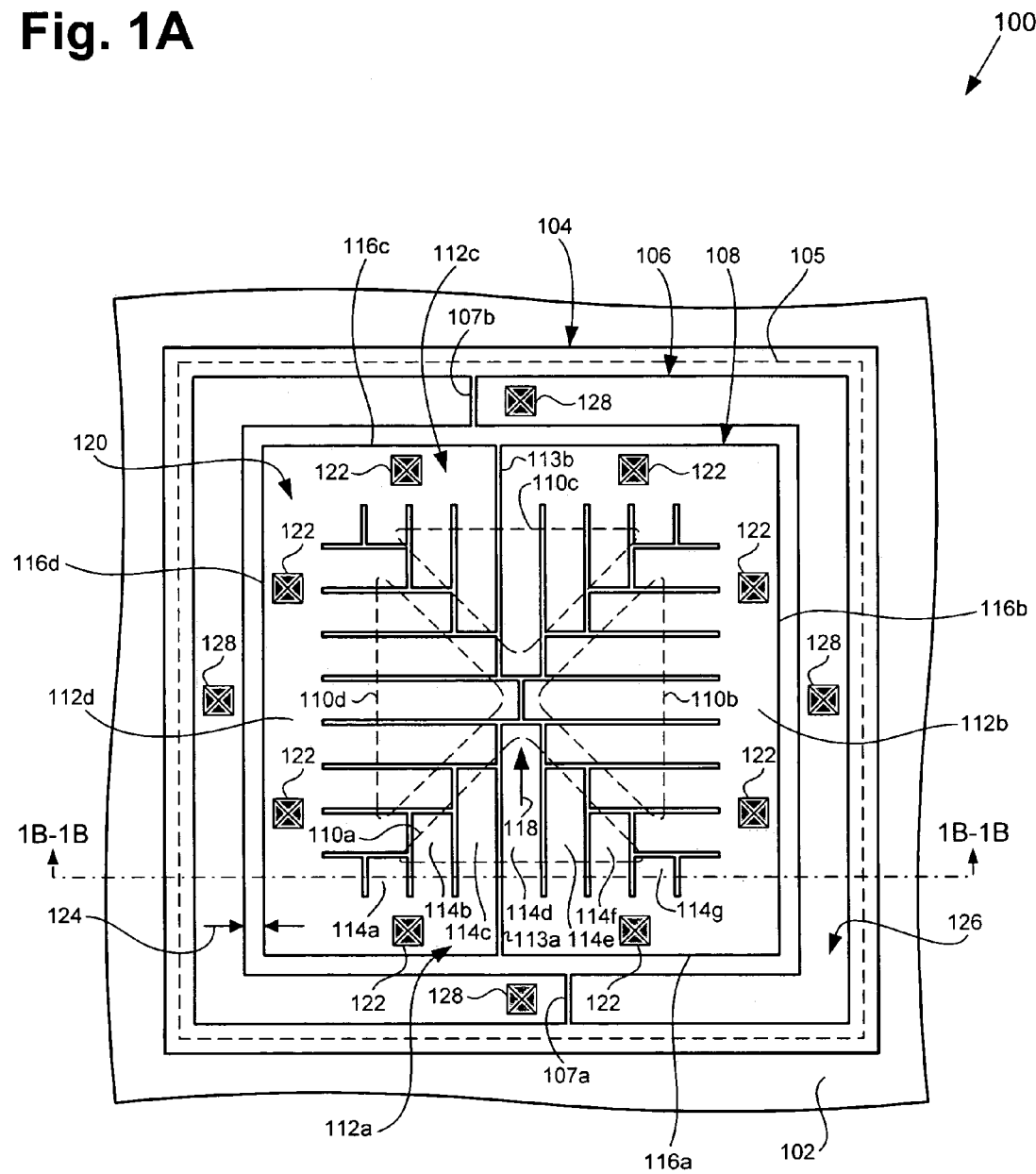
FIG. 1A illustrates a top view of an exemplary structure including an exemplary composite ground shield in accordance with one embodiment of the present invention.

FIG. 1A shows a top view of a portion of a semiconductor die including an exemplary composite ground shield in accordance with one embodiment of the present invention. Certain details and features have been left out of FIG. 1A, which are apparent to a person of ordinary skill in the art. As shown in FIG. 1A, structure 100 includes substrate 102, well 104, and composite ground shield 105, which includes salicided active region 106 and active shield 108. Active shield 108 further includes finger regions 110a, 110b, 110c, and 110d and segments 112a, 112b, 112c, and 112d. Finger region 110a further includes fingers 114a, 114b, 114c, 114d, 114e, 114f, and 114g.

Also shown in FIG. 1A, well 104 is situated in substrate 102. Substrate 102 can be lightly doped with a P type dopant to form a substrate having P type conductivity, i.e. a P substrate. In the present embodiment, well 104 can be lightly doped with an N type dopant to form a well having N type conductivity, i.e. an N well. In one embodiment, well 104 can be a P well, i.e. it can be lightly doped with a P type dopant. Further shown in FIG. 1A, active shield 108 is situated in well 104. Active shield 108 includes finger regions 110a, 110b, 110c, and 110d, which are connected to active shield segments 112*a*, 112*b*, 112*c*, and 112*d*, respectively. Active shield segments 112*a*, 112*b*, 112*c*, and 112*d* extend along sides 116*a*, 116*b*, 116*c*, and 116*d* of active shield 108, respectively. Active shield segments 112*a* and 112*c* include gaps 113*a* and 113*b*, respectively, which can prevent magnetically induced eddy currents from a passive component, such as an inductor, a transformer, or a balun, situated above active shield 108 from forming a closed current loop. Finger region 110*a* includes fingers 114*a*, 114*b*, 114*c*, 114*d*, 114*e*, 114*f*, and 114*g*, which extend from active shield segment 112*a* toward the center of active shield 108, as indicated by arrow 118.

As shown in FIG. 1A, finger 114*d*, which is the longest finger in finger region 110*a*, extends from the approximate center of active shield segment 112*a* to the approximate center of active shield 108. Fingers 114*c* and 114*e*, which are shorter than finger 114*d*, i.e. they do not extend as far toward the center of active shield 108 as finger 114*d*, are situated along respective sides of finger 114*d*. Fingers 114*b* and 114*f*, which are shorter than fingers 114*c* and 114*e*, are situated along respective sides of fingers 114*c* and 114*e*, and fingers 114*a* and 114*g*, which are the shortest fingers in finger region 110*a*, are situated along respective sides of fingers 114*b* and 114*f*.

Finger regions 110*b*, 110*c*, and 110*d* each comprise a group of fingers, such as fingers 114*a*, 114*b*, 114*c*, 114*d*, 114*e*, 114*f*, and 114*g*, which extend from respective active shield segments 112*b*, 112*c*, and 112*d* toward the center of active shield 108. As a result, the group of fingers in each of finger regions 110*a* and 110*c* are situated perpendicular to the group of fingers in each of finger regions 110*b* and 110*d*. It is noted that only fingers 114*a*, 114*b*, 114*c*, 114*d*, 114*e*, 114*f*, and 114*g* in finger region 10*a* are specifically discussed in the present application to preserve brevity.

In the present embodiment, active shield 108 comprises a P type active region (not shown in FIG. 1A), which is situated in well 104, and salicide layer 120, which is situated on the P type active region (not shown in FIG. 1A). Thus, active shield 108 is a P type active shield. In an embodiment in which well 104 is a P well, active shield 108 can be an N type active shield, which can comprise a silicide layer situated over an N type active region. Active shield 108, including finger regions 110*a*, 110*b*, 110*c*, and 110*d* and active shield segments 112*a*, 112*b*, 112*c*, and 112*d*, can be formed by appropriately patterning silicon in substrate 102 to form a patterned silicon region. The patterned silicon region can be implanted with a P type dopant to form a P type active region, which is situated in well 104.

A mask can then be formed over the wafer to protect portions of the wafer from a subsequent silicide process, while leaving P type active region exposed, i.e. unmasked. Next, a salicide layer, i.e. salicide layer 120, can be formed on the exposed P type active region by using a salicide process. By way of background, salicide is the process of forming self-aligned silicide. In the salicide process, the entire wafer is covered with metal, such as titanium, cobalt, nickel, or other appropriate metal, and silicide is formed only where silicon is exposed. Salicide layer 120 can comprise titanium silicide ("TiSi$_2$"), cobalt silicide ("CoSi$_2$"), nickel mono-silicide ("NiSi"), or other appropriate silicide.

Further shown in FIG. 1A, contacts 122 are situated on active shield segments 112*a*, 112*b*, 112*c*, and 112*d* and electrically connect active shield 108 to a feed line (not shown in FIG. 1A) in interconnect metal layer one, i.e. M1. The M1 feed line (not shown in FIG. 1A) can be connected to ground in the semiconductor die. Thus, contacts 122 electrically connect active shield 108 to the semiconductor die ground. Also shown in FIG. 1A, salicided active region 106 is situated in well 104 and also situated along sides 116*a*, 116*b*, 116*c*, and 116*d* of active shield 108 such that salicided active region 106 surrounds active shield 108. In other embodiments, salicided active region 106 may be situated along one, two, or three sides of active shield 108. Salicided active region 106 is appropriately separated from active shield 108 by distance 124. In the present embodiment, salicided active region 106 comprises an N type active region (not shown in FIG. 1A), which is situated in well 104, and salicide layer 126, which is situated on the N type active region (not shown in FIG. 1A). Salicided active region 106 includes gaps 107*a* and 107*b* which can prevent magnetically induced eddy currents from a passive component, such as an inductor, transformer, or balun, situated above active shield 108 from forming a closed current loop.

Salicided active region 106 can be formed by appropriately patterning silicon in well 104 and heavily doping the patterned silicon with an N type dopant. A salicide process can then be used to form a salicide layer, i.e. salicide layer 126, on the N type active region and complete the formation salicided active region 106. Salicide layer 126 is substantially similar in composition to salicide layer 120. Thus, since salicided active region 106 and well 104 each have N type conductivity, salicided active region 106 forms an ohmic contact with well 104.

Further shown in FIG. 1A, contacts 128 are situated on salicided active region 106 and can be connected to a feed line (not shown in FIG. 1A) in M1. The feed line (not shown in FIG. 1A) in M1 can be connected to a voltage source greater than or equal to ground and having no AC component, such as Vdd. In an embodiment in which active shield 108 is an N type active shield, well 104 is a P well, and salicided active region 106 comprises a P type active region, contacts 128 can electrically connect well 104 to ground.

Figure 1B:
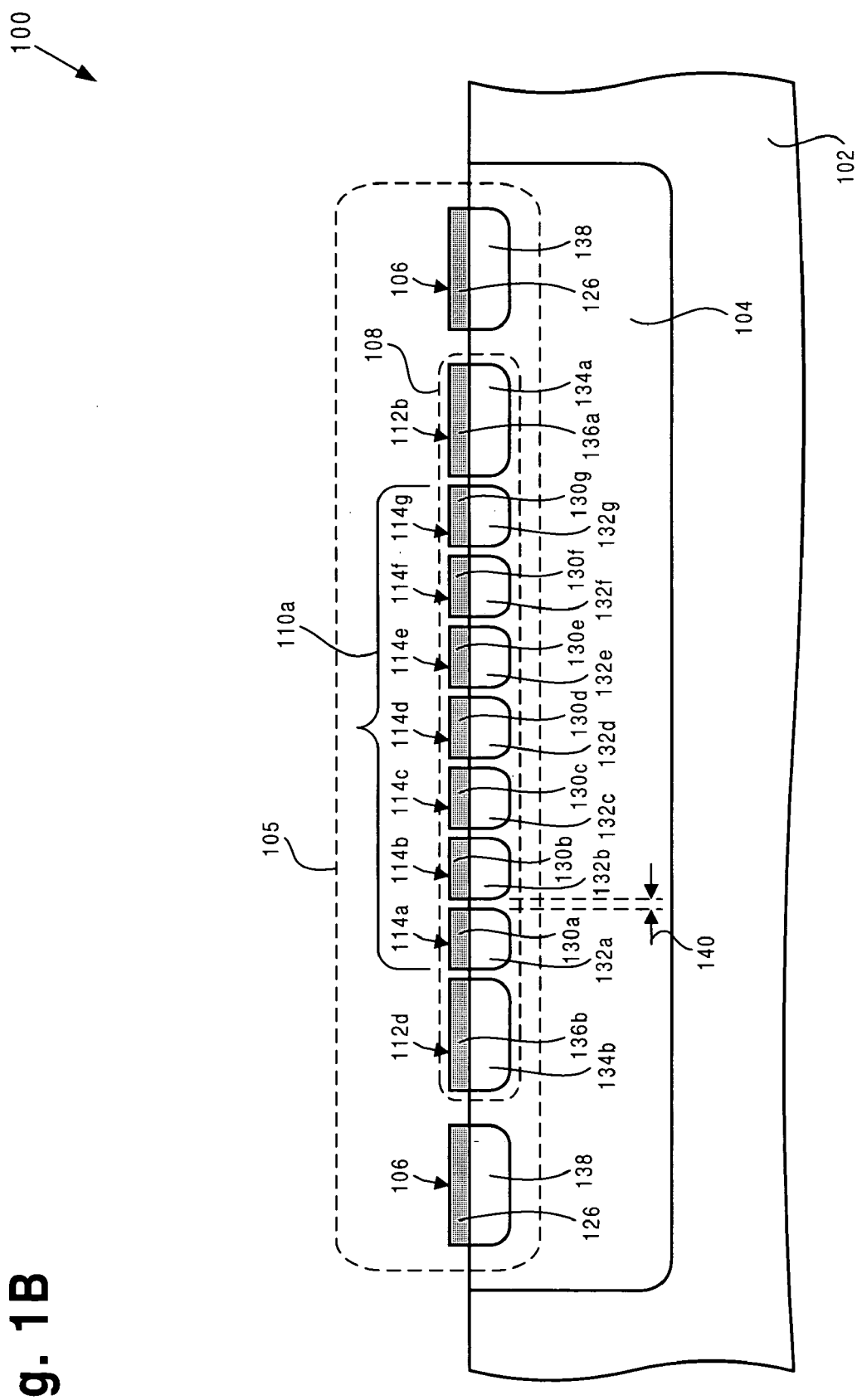
FIG. 1B illustrates a cross sectional view of the exemplary structure in FIG. 1A.

FIG. 1B shows a cross-sectional view of structure 100 in FIG. 1A along line 1B—1B in FIG. 1A. In particular, substrate 102, well 104, composite ground shield 105, salicided active region 106, active shield 108, finger region 110*a*, active shield segments 112*b* and 112*d*, fingers 114*a*, 114*b*, 114*c*, 114*d*, 114*e*, 114*f*, and 114*g*, and salicide layer 126 correspond to the same elements in FIG. 1A and FIG. 1B. Fingers 114*a*, 114*b*, 114*c*, 114*d*, 114*e*, 114*f*, and 114*g* include salicide segments 130*a*, 130*b*, 130*c*, 130*d*, 130*e*, 130*f*, and 130*g* and active segments 132*a*, 132*b*, 132*c*, 132*d*, 132*e*, 132*f*, and 132*g*, respectively. Active shield segments 112*b* and 112*d* include active segments 134*a* and 134*b* and salicide segments 136*a* and 136*b*, respectively, and salicided active region 106 includes active region 138 and salicide layer 126.

As shown in FIG. 1B, active segments 132*a*, 132*b*, 132*c*, 132*d*, 132*e*, 132*f*, 132*g* and 134*a* and 134*b* are situated in well 104 and comprise silicon that is heavily doped with a P type dopant. Also shown in FIG. 1B, active region 138 is situated in well 104 and comprises silicon that is heavily doped with an N type dopant. In an embodiment in which well 104 is a P well and active shield 108 is an N type active shield, active segments 132*a*, 132*b*, 132*c*, 132*d*, 132*e*, 132*f*, 132*g* and 134*a* and 134*b* comprise silicon that is heavily doped with an N type dopant, and active segments 134*a* and 134 can comprise silicon that is heavily doped with a P type dopant.

Also shown in FIG. 1B, salicide segments 130*a*, 130*b*, 130*c*, 130*d*, 130*e*, 130*f*, and 130*g* and 136*a* and 136*b*, which form a portion of salicide layer 120 in FIG. 1A, are situated on active segments 132*a*, 132*b*, 132*c*, 132*d*, 132*e*, 132*f*, 132*g* and 134*a* and 134*b*, respectively. Salicide segments 130a, 130b, 130c, 130d, 130e, 130f, and 130g and 136a and 136b reduce the resistance of fingers 114a, 114b, 114c, 114d, 114e, 114f, and 114g and active shield segments 112b and 112d, respectively. Further shown in FIG. 1B, salicide layer 126 is situated on active region 138 and provides reduced resistance in salicided active region 106. Also shown in FIG. 1B, distance 140 indicates the spacing between fingers, such as fingers 114a and 114b. Distance 140 can be appropriately adjusted to provide a minimal separation distance between adjacent fingers in finger regions 110a, 110b, 110c, and 110d in FIG. 1A.

Figure 2:
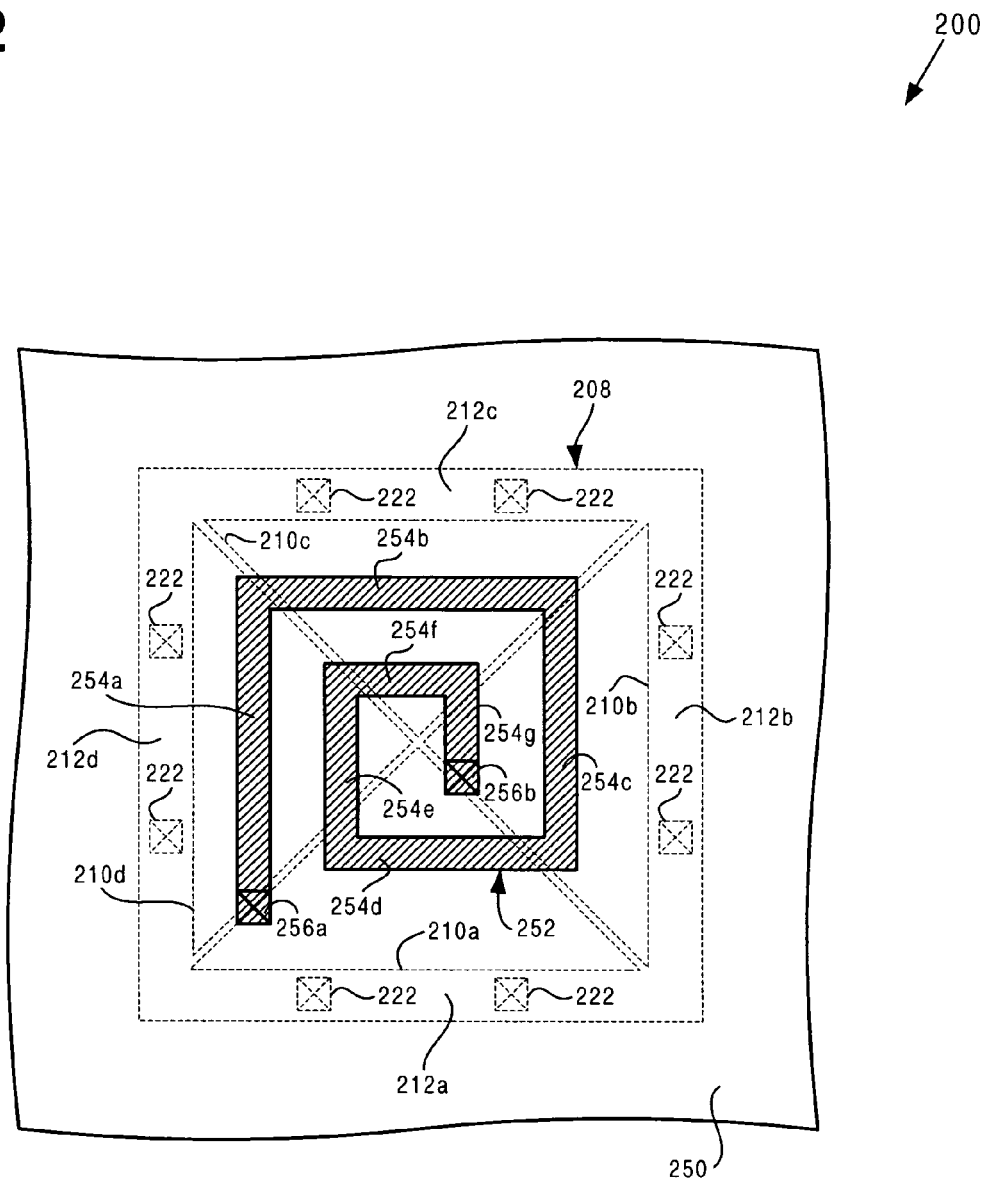
FIG. 2 illustrates a top view of an exemplary structure including an exemplary inductor situated over an exemplary active shield in accordance with one embodiment of the present invention.

FIG. 2 shows a top view of a portion of a semiconductor die including an exemplary inductor situated over an exemplary active shield in accordance with one embodiment of the present invention. In FIG. 2, active shield 208, finger regions 210a, 210b, 210c, and 210d, active shield segments 212a, 212b, 212c, and 212d, and contacts 222 in structure 200 correspond, respectively, to active shield 108, finger regions 110a, 110b, 110c, and 110d, active shield segments 112a, 112b, 112c, and 112d, and contacts 122 in structure 100 in FIG. 1A. Structure 200 also includes dielectric layer 250 and inductor 252.

As shown in FIG. 2, inductor 252 is situated on dielectric layer 250 and includes interconnect metal segments 254a, 254b, 254c, 254d, 254e, 254f, and 254g and terminals 256a and 256b. Inductor 252 is a square spiral inductor having winding pattern that comprises interconnect metal segments 254a, 254b, 254c, 254d, 254e, 254f, and 254g. Inductor 252 can be situated in the top interconnect metal layer in the semiconductor die, such as interconnect metal layer six, i.e. "M6," and can be formed by appropriately patterning and etching a layer of interconnect metal. In other embodiments, inductor 252 can have an octagonal, circular, or rectangular shape. Terminals 256a and 256b are connected to interconnect metal segments 254a and 254g, respectively. Inductor 252 is also situated over active shield 208.

In particular, interconnect metal segments 254a and 254e are situated over finger region 210d, interconnect metal segments 254b and 254f are situated over finger region 210c, interconnect metal segments 254c and 254g are situated over finger region 210b, and interconnect metal segment 254d is situated over finger region 210a. Also, the fingers in each respective finger region are situated perpendicular to the interconnect metal segment(s) that are situated over the respective finger region. For example, the fingers in finger region 210a, such as fingers 114a, 114b, 114c, 114d, 114e, 114f, and 114g in FIG. 1A, are situated perpendicular to interconnect metal segment 254d. Thus, since each interconnect metal segment in the winding pattern of inductor 252 is situated perpendicular to fingers in the particular finger region that is situated under the interconnect metal segment, image currents are prevented from being induced in the finger regions of the active shield, such as finger regions 210a, 210b, 210c, and 210d, by the magnetic field of inductor 252.

The operation of the present invention's composite ground shield will now be discussed in relation to FIGS. 1A, 1B, and 2. Active shield 108 in FIGS. 1A and 1B can be situated under a passive component, such as inductor 252 in FIG. 2, which can be situated in M6. In other embodiments, the passive component can be a transformer or a balun. Since active shield 108 is electrically connected to ground in the semiconductor die by contacts 122 and a feed line in M1 (not shown in any of the figures), active shield 108 provides a clearly defined AC ground for inductor 252. Thus the fingers in the finger regions of active shield 108, such as fingers 114a and 114b in finger region 10a, can effectively terminate the electric field generated by inductor 252. As a result of effectively terminating the electric field generated by inductor 252, the Q of inductor 252 is increased.

Also, since active shield 108 is formed in a salicided active region in well 104, it, i.e. active shield 108, is situated a greater distance from inductor 252 compared to a conventional ground shield, which is situated in either M1 or polysilicon. By way of example, a conventional ground shield situated in polysilicon can be between approximately 2.0% and approximately 3.0% closer to inductor 252 (as situated in M6) compared to active shield 108, which is situated in an active region in well 104. By way of further example, a conventional ground shield situated in M1 can be approximately 10.0% closer to inductor 252 (as situated in M6) compared to active shield 108. As discussed above, a ground shield causes a capacitance effect on an inductor that is inversely proportional to the distance between the interconnect metal layer that the inductor is fabricated in and the ground shield. Thus, by forming an active shield in a salicided active region, the present invention advantageously achieves an active shield having a reduced capacitance effect on an inductor situated above the active shield compared to a conventional ground shield.

Additionally, the present invention's composite ground shield, i.e. composite ground shield 105, provides salicided active region 106, which surrounds active shield 108, has N type conductivity, and is situated in an N well, i.e. well 104. Since active shield 108 is a P type active shield, a "PN" junction is formed between active shield 108 and well 104. Thus, by connecting salicided active region 106 to a voltage source greater than or equal to ground and having no AC component, the "PN" junction is reverse or zero biased, which minimizes leakage current flowing between active shield 108 and well 104. Additionally, any RF noise injected into well 104 by inductor 252 will be shunted to AC ground.

Also, since substrate 102 is a P type substrate in the present embodiment, a "PN" junction is formed between substrate 102 and well 104, which is also reverse or zero biased by connecting salicide active region 106 to a voltage source greater than or equal to ground and having no AC component. Thus, the "PN" junction formed between substrate 102 and well 104 provides additional noise isolation. However, not connecting the well, i.e. well 104, and leaving it floating will not impair the function of the shield, i.e. active shield 108. In the present embodiment, substrate 102 is not connected to a voltage source, i.e. it is left floating. In one embodiment, substrate 102 may be connected by an ohmic contact to a voltage source greater than or equal to ground voltage, i.e. "ground," and having no AC component, which provides an additional path for shunting RF noise in substrate 102 to AC ground.

In one embodiment, active shield 108 is an N type active shield, well 104 is a P well, substrate 102 is a P substrate, and salicided active region 106 has P type conductivity and forms an ohmic contact with well 104. In that embodiment, the "PN" junction formed between the P well and the N type active shield can be zero biased by connecting the P well to a voltage source equal to ground through salicided active region 106, which minimizes leakage current in the P well and also shunts RF noise in the P well or P substrate to AC ground. In other embodiments, active shield 108 and well 104 can have the same conductivity type. For example, active shield 108 and well 104 can both have N type conductivity or they, i.e. active shield 108 and well 104, can both have P type conductivity.

In another embodiment, active shield 108 can be formed directly in a substrate without utilizing a well, such as well 104. In such embodiment, active shield 108 and the substrate would have an opposite conductivity type. For example, if active shield 108 were formed in a P type substrate, active shield 108 would be an N type active shield, and if active shield 108 were formed in an N type substrate, active shield 108 would be a P type active shield.

Thus, as discussed above, by forming a composite ground shield in a salicided active region in a well, the present invention advantageously achieves a composite ground shield that clearly defines an AC ground for a passive component, such as an inductor, situated above the composite ground shield, while providing a reduced capacitance effect on the inductor compared to a conventional ground shield. Furthermore, by integrating a salicided active region with an active shield in a composite ground shield, the present invention advantageously minimizes leakage current between the active shield and the well in which the active shield is situated while shunting RF noise in the well or substrate to AC ground.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, composite ground shield for passive components in a semiconductor die has been described.

The invention claimed is:

1. A structure situated in a semiconductor die, said structure comprising:
   an active shield situated in a silicon substrate, said active shield comprising a salicide layer situated on an active region, said active shield having a first conductivity type;
   a passive component situated in an interconnect metal layer in said semiconductor die, said passive component being situated above said active shield;
   a salicided active region situated in said silicon substrate, said salicided active region situated adjacent to at least one side of, and formed apart from, said active shield, said salicided active region having a second conductivity type;
   wherein said active shield defines an AC ground for said passive component.

2. The structure of claim 1 further comprising at least one contact, said at least one contact connecting said active shield to a semiconductor die AC ground.

3. The structure of claim 1 further comprising a well situated in said silicon substrate, said active shield being situated in said well, said well having said second conductivity type.

4. The structure of claim 1 wherein said active shield comprises a plurality of fingers, each of said plurality of fingers comprising a salicide segment situated on an active segment.

5. The structure of claim 1 wherein said passive component is an inductor.

6. The structure of claim 3 wherein said salicided active region is situated in said well.

7. The structure of claim 1 wherein said salicide layer is selected from the group consisting of titanium silicide, cobalt silicide, and nickel mono-silicide.

8. The structure of claim 3 wherein said well is connected to a voltage source, said voltage source being greater than or equal to ground voltage, said voltage source having no AC component.

9. The structure of claim 1 further comprising a well situated in said silicon substrate, said active shield being situated in said well, said well having said first conductivity type.

10. A structure situated in a semiconductor die, said structure comprising:
    a well situated in a substrate, said well having a first conductivity type;
    an active shield situated in said well, said active shield comprising a salicide layer situated on an active region in said well, said active shield having a second conductivity type;
    a passive component situated in an interconnect metal layer in said semiconductor die, said passive component being situated above said active shield;
    a salicided active region situated adjacent to at least one side of, and formed apart from, said active shield, said salicided active region having said first conductivity type, said salicided active region being situated in said well;
    wherein said active shield defines an AC ground for said passive component.

11. The structure of claim 10 further comprising at least one contact, said at least one contact connecting said active shield to a semiconductor die AC ground.

12. The structure of claim 10 wherein said active shield comprises a plurality of fingers, each of said plurality of fingers comprising a salicide segment situated on an active segment.

13. The structure of claim 10 wherein said passive component is an inductor.

14. The structure of claim 10 wherein said salicided active region is connected to a voltage source, said voltage source being greater than or equal to ground voltage, said voltage source having no AC component.

15. The structure of claim 10 wherein said salicide layer is selected from the group consisting of titanium silicide, cobalt silicide, and nickel mono silicide.

16. A structure situated in a semiconductor die, said structure comprising:
    a well situated in a substrate, said well having a first conductivity type;
    an active shield situated in said well, said active shield comprising a plurality of fingers, each of said plurality of fingers comprising a salicide segment situated on an active segment, said each of said plurality of fingers having a second conductivity type;
    a salicided active region situated adjacent to at least one side of, and formed apart from, said active shield, said salicided active region having said first conductivity type, said salicided active region being situated in said well;
    a passive component situated in an interconnect metal layer in said semiconductor die, said passive component being situated above said active shield;
    wherein said active shield defines an AC ground for said passive component.

17. The structure of claim 16 further comprising at least one contact, said at least one contact connecting said active shield to a semiconductor die AC ground.

18. The structure of claim 16 wherein said passive component is an inductor, wherein said plurality of fingers terminate an electric field of said inductor.

19. The structure of claim 16 wherein said salicided active region is connected to a voltage source, said voltage source being greater than or equal to ground voltage, said voltage source having no AC component.

* * * * *

UNITED STATES PATENT AND TRADEMARK OFFICE
CERTIFICATE OF CORRECTION

| | |
|---|---|
| PATENT NO. | : 7,154,161 B1 |
| APPLICATION NO. | : 10/826507 |
| DATED | : December 26, 2006 |
| INVENTOR(S) | : Blaschke et al. |

It is certified that error appears in the above-identified patent and that said Letters Patent is hereby corrected as shown below:

In the claims, column 8, line 45, "mono silicide" should be changed to --mono-silicide--.

Signed and Sealed this

Tenth Day of July, 2007

JON W. DUDAS
*Director of the United States Patent and Trademark Office*